(12) United States Patent
Yasui

(10) Patent No.: US 11,933,846 B2
(45) Date of Patent: Mar. 19, 2024

(54) MEMORY TESTER AND TEST METHOD THAT USES MEMORY TESTER

(71) Applicant: Kioxia Corporation, Tokyo (JP)

(72) Inventor: Kenji Yasui, Tokyo (JP)

(73) Assignee: Kioxia Coporation, Tokyo (JP)

( * ) Notice: Subject to any disclaimer, the term of this patent is extended or adjusted under 35 U.S.C. 154(b) by 0 days.

(21) Appl. No.: 17/941,439

(22) Filed: Sep. 9, 2022

(65) Prior Publication Data

US 2023/0296671 A1 Sep. 21, 2023

(30) Foreign Application Priority Data

Mar. 18, 2022 (JP) .................................. 2022-044465

(51) Int. Cl.
*G01R 13/28* (2006.01)
*G01R 31/3185* (2006.01)

(52) U.S. Cl.
CPC ............................ *G01R 31/318547* (2013.01)

(58) Field of Classification Search
CPC ........ G01R 31/318547; G01R 31/2815; G01R 31/3185; G01R 31/318533; G01R 31/318536; G01R 31/318541; G01R 31/318544; G01R 31/318583; G01R 31/318586; G11C 29/32; G11C 2029/3202
USPC .................................................. 714/718, 726
See application file for complete search history.

(56) References Cited

U.S. PATENT DOCUMENTS

| | | | | |
|---|---|---|---|---|
| 4,016,549 A | * | 4/1977 | Hutner | G03G 15/50 358/1.7 |
| 5,815,512 A | * | 9/1998 | Osawa | G11C 29/32 365/201 |
| 7,971,118 B2 | * | 6/2011 | Wen | G01R 31/318547 714/726 |
| 2004/0148554 A1 | * | 7/2004 | Dervisoglu | G01R 31/318552 714/727 |
| 2005/0028060 A1 | * | 2/2005 | Dervisoglu | G01R 31/318335 714/726 |

(Continued)

FOREIGN PATENT DOCUMENTS

JP 2001174528 A * 6/2001
JP 2007-322415 12/2007
(Continued)

*Primary Examiner* — Albert Decady
*Assistant Examiner* — Osman M Alshack
(74) *Attorney, Agent, or Firm* — Foley & Lardner LLP

(57) ABSTRACT

A memory tester of the present embodiment includes a first memory, a second memory, an arithmetic circuit, and a determination circuit. The first memory is configured to store scan input data and expected value data, the scan input data including a don't care bit, the expected value data being obtained by converting the don't care bit into a first predetermined value. The second memory is configured to store scan output data and mask data obtained by converting a value of the scan input data other than the don't care bit into a second predetermined value. The arithmetic circuit is configured to perform an exclusive or operation between the expected value data and the scan output data. The determination circuit is configured to determine whether the don't care bit of an arithmetic result from the arithmetic circuit is passed or failed by using the mask data.

2 Claims, 4 Drawing Sheets

(56) References Cited

U.S. PATENT DOCUMENTS

| | | | |
|---|---|---|---|
| 2006/0167843 A1* | 7/2006 | Allwright | G06F 16/9017 |
| | | | 707/E17.037 |
| 2007/0288819 A1 | 12/2007 | Matsuo et al. | |
| 2011/0041019 A1* | 2/2011 | Whetsel | G01R 31/318563 |
| | | | 714/E11.02 |
| 2011/0307748 A1* | 12/2011 | Laisne | G01R 31/318566 |
| | | | 714/E11.155 |
| 2016/0294413 A1* | 10/2016 | Schmit | H03M 13/05 |
| 2018/0059183 A1 | 3/2018 | Maeda et al. | |
| 2019/0178935 A1* | 6/2019 | Bernard | G01R 31/3177 |
| 2019/0318083 A1* | 10/2019 | Schat | G01R 31/31707 |

FOREIGN PATENT DOCUMENTS

| | | |
|---|---|---|
| JP | 2009-204402 | 9/2009 |
| WO | WO-2016/166780 | 10/2016 |

\* cited by examiner

110100X0

11010000

11010010

00000010

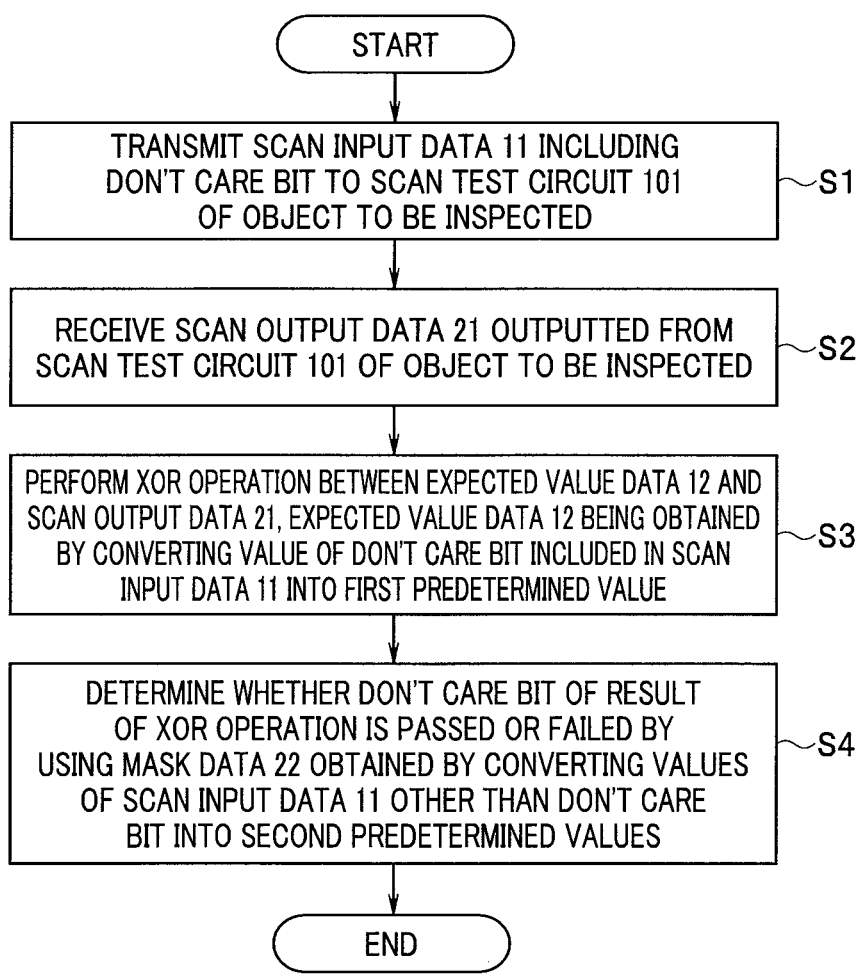

MEMORY TESTER AND TEST METHOD THAT USES MEMORY TESTER

CROSS-REFERENCE TO RELATED APPLICATIONS

This application is based upon and claims the benefit of priority from the prior Japanese Patent Application No. 2022-44465 filed on Mar. 18, 2022; the entire contents of which are incorporated herein by reference.

FIELD

Embodiments described herein relate to a memory tester and a test method that uses the memory tester.

BACKGROUND

There are known memory testers that inspect semiconductor devices, such as NAND type flash memories.

BRIEF DESCRIPTION OF THE DRAWINGS

FIG. 7 is a flowchart showing one example of the flow of a scan test including a don't care bit.

DETAILED DESCRIPTION

A memory tester of the present embodiment includes a first memory, a second memory, an arithmetic circuit, and a determination circuit. The first memory is configured to store scan input data and expected value data, the scan input data including a don't care bit, the expected value data being obtained by converting the don't care bit of the scan input data into a first predetermined value. The second memory is configured to store scan output data and mask data, the scan output data being outputted from a scan test circuit, the mask data being obtained by converting a value of the scan input data other than the don't care bit into a second predetermined value. The arithmetic circuit is configured to perform an exclusive or operation between the expected value data and the scan output data. The determination circuit is configured to determine whether the don't care bit of an arithmetic result from the arithmetic circuit is passed or failed by using the mask data.

Hereinafter, embodiments will be described with reference to drawings.

First Embodiment

Figure 1:
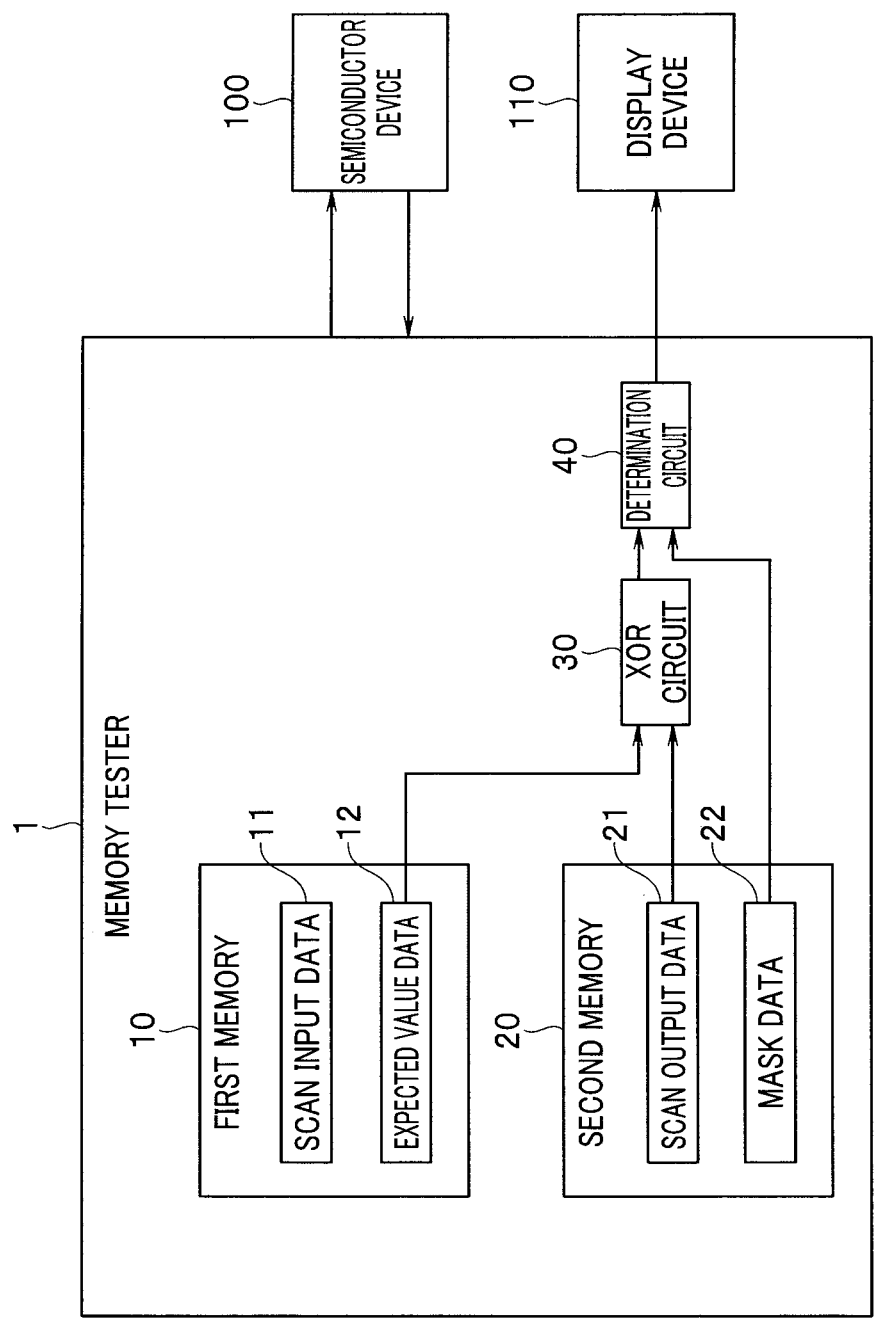
FIG. 1 is a block diagram showing one example of the configuration of a memory tester according to a first embodiment.
Figure 2:
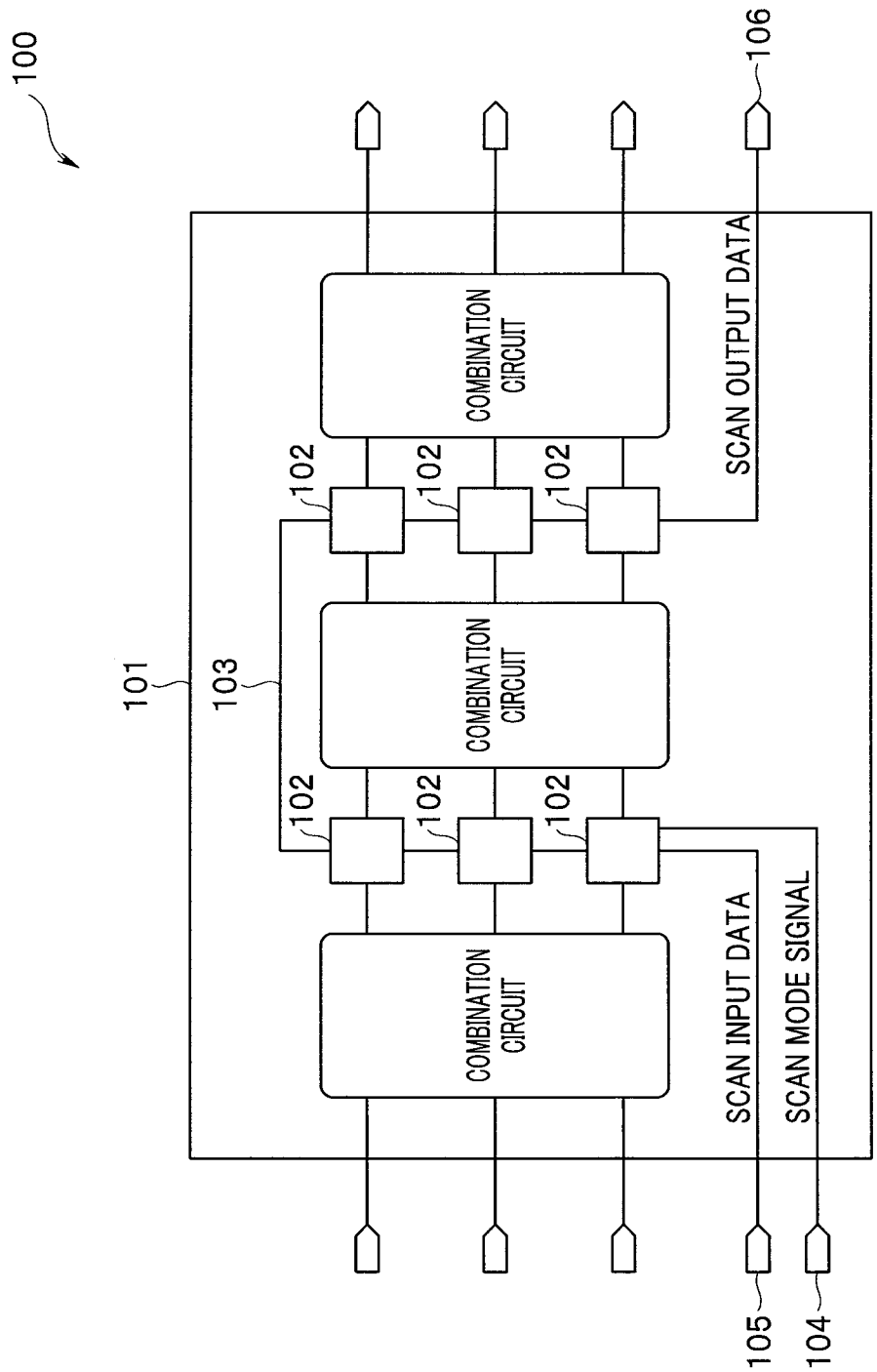
FIG. 2 is a block diagram showing one example of the configuration of a scan test circuit.

FIG. 1 is a block diagram showing one example of the configuration of a memory tester according to a first embodiment. FIG. 2 is a block diagram showing one example of the configuration of a scan test circuit.

A memory tester 1 performs a scan test on a semiconductor device 100, such as a NAND type flash memory, by using scan input data including a don't care bit, and causes a display device 110, such as a liquid crystal display, to display the scan test result.

As shown in FIG. 2, in the semiconductor device 100, a scan test circuit 101 is formed on a logic circuit portion. The scan test circuit 101 includes a scan chain 103 where all flip-flops (hereinafter referred to as "FFs") of the logic circuit portion are replaced with scan FFs 102, and the scan FFs 102 are serially connected.

The scan test circuit 101 includes a scan mode terminal 104, a scan-in terminal 105, and a scan-out terminal 106. When a scan mode signal (scan enable signal) is inputted to the scan mode terminal 104 from the memory tester 1, a normal operation mode and a scan test mode are switched.

Scan input data are inputted to the scan-in terminal 105 from the memory tester 1. The scan-out terminal 106 outputs scan output data to the memory tester 1, the scan output data being an output signal from the scan chain 103.

Returning to FIG. 1, the memory tester 1 includes a first memory 10, a second memory 20, an XOR circuit 30, and a determination circuit 40.

The first memory 10 stores scan input data 11 and expected value data 12. The second memory 20 stores scan output data 21 and mask data 22.

The scan input data 11, the expected value data 12, the scan output data 21, and the mask data 22 will be described with reference to FIG. 3 to FIG. 6.

Figure 3:
FIG. 3 is a diagram for describing one example of scan input data.
Figure 4:
FIG. 4 is a diagram for describing one example of expected value data.
Figure 5:
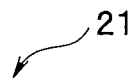
FIG. 5 is a diagram for describing one example of scan output data.
Figure 6:
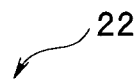
FIG. 6 is a diagram for describing one example of mask data.

FIG. 3 is a diagram for describing one example of the scan input data. FIG. 4 is a diagram for describing one example of the expected value data. FIG. 5 is a diagram for describing one example of scan output data. FIG. 6 is a diagram for describing one example of the mask data. Each data include a large number of bits and hence, only data for 8 bits are shown in FIG. 3 to FIG. 6.

As shown in FIG. 3, the scan input data 11 are data "110100X0" including a don't care bit. The don't care bit is an intermediate voltage between 0 and 1, and is indicated by "X". In other words, in the example shown in FIG. 3, the second bit from the least significant bit of the scan input data 11 corresponds to the don't care bit.

The expected value data 12 are expected values of output data obtained by converting the value of the don't care bit of the scan input data 11 into a first predetermined value (0 or 1). In the example shown in FIG. 4, the expected value data 12 are data "11010000" obtained by converting the don't care bit into 0, the don't care bit being the second bit from the least significant bit of the scan input data 11.

The scan output data 21 are the scan test results outputted from the scan-out terminal 106 as a result of inputting of the scan input data 11 to the scan-in terminal 105 of a scan test circuit 101. The scan output data 21 outputted from the scan test circuit 101 of the semiconductor device 100 are stored in the second memory 20. In the example shown in FIG. 5, the scan output data 21 are data "11010010", in which 1 is outputted as the output that corresponds to the don't care bit.

The mask data 22 are data obtained by converting the values of the scan input data 11 other than the don't care bit into second predetermined values (0 or 1) to mask the don't care bit. In the example shown in FIG. 6, the mask data 22 are data "00000010" obtained by converting the values of the scan input data 11 other than the don't care bit into 0.

The expected value data 12 stored in the first memory 10 and the scan output data 21 stored in the second memory 20 are inputted to the XOR circuit 30. The XOR circuit 30 forming arithmetic circuit performs an XOR (Exclusive or)

operation between the expected value data 12 and the scan output data 21, and outputs the arithmetic result to the determination circuit 40.

To be more specific, the XOR circuit 30 performs the XOR operation between "11010000", being the expected value data 12, and "11010010", being the scan output data 21, and outputs "00000010", being the result of the XOR operation, to the determination circuit 40.

The determination circuit 40 determines whether "00000010", being the arithmetic result from the XOR circuit 30, is passed or failed with respect to the position with "1" in "00000010" of the mask data 22. Then, the determination circuit 40 causes the display device 110 to display the determination result. With such an operation, the memory tester 1 can determine only the don't care bit.

Next, a test method that uses the memory tester having such a configuration will be described.

FIG. 7 is a flowchart showing one example of the flow of a scan test including the don't care bit.

First, the memory tester 1 transmits the scan input data 11 including the don't care bit to the scan test circuit 101 of an object to be inspected (step S1). The scan input data 11 form a test pattern for performing a scan test. The scan input data 11 are created in advance before the scan test is performed, and the scan input data 11 are stored in the first memory 10.

Next, the memory tester 1 receives the scan output data 21 outputted from the scan test circuit 101 of the object to be inspected (step S2). The scan output data 21 outputted from the scan test circuit 101 are stored in the second memory 20.

Then, the memory tester 1 performs an XOR operation between the expected value data 12 and the scan output data 21, the expected value data 12 being obtained by converting the value of the don't care bit included in the scan input data 11 into the first predetermined value (step S3). The predetermined value is 0 or 1. For example, in the case where the value of the don't care bit is converted into "0", the expected value data 12 shown in FIG. 4 are obtained.

Finally, the memory tester 1 determines whether the don't care bit of the result of the XOR operation is passed or failed by using the mask data 22 obtained by converting the values of the scan input data 11 other than the don't care bit into second predetermined values (step S4).

The predetermined value is 0 or 1. For example, in the case where the values other than the don't care bit are converted into 0, the mask data 22 shown in FIG. 6 are obtained. By using the mask data 22 obtained by converting the values of the scan input data 11 other than the don't care bit into 0, the memory tester 1 can obtain the inspection result only for the don't care bit.

By performing the above-mentioned process, the memory tester 1 can determine whether the scan input data 11 including the don't care bit are passed or failed.

Second Embodiment

Next, a second embodiment will be described.

The first memory 10 and the second memory 20 of the memory tester 1 have an upper limitation on the data area that can store data. For this reason, for example, the scan input data 11 are stored in the first memory 10 in a state where a test pattern is divided into groups of a predetermined number of bits (8 bits, for example).

In the case where the test pattern is divided into groups of 8 bits, for example, the test pattern is divided into multiples of 8, and is stored in the first memory 10 as 8-bit data. In the case where the test pattern cannot be divided by 8 in dividing the test pattern, data are added to the low-order bits to bring the test pattern to a multiple of 8.

The semiconductor device 100, being a NAND type flash memory, for example, includes input and output terminals. When a scan test is performed, 8-bit data stored in the first memory 10 are inputted to the input and output terminals. When the 8-bit data are inputted to the input and output terminals, the 8-bit data are inputted to the input and output terminals in order from the most significant bit of the 8-bit data.

However, to properly perform the scan test, it is necessary to input the 8-bit data to the input and output terminals in order from the least significant bit of the 8-bit data.

Therefore, the bit strings of the 8-bit data, which are obtained by dividing the test pattern into multiples of 8, are inverted, and the obtained data are stored in the first memory 10 as the scan input data 11. To be more specific, in the case where 8-bit data "11010100" are stored in the first memory 10, the bit string of the 8-bit data "11010100" is inverted, and the obtained data "00101011" are stored in the first memory 10 as the scan input data 11.

At this point of operation, the 8-bit data expressed in a binary number system are converted into hexadecimal binary data, in the present embodiment, into "2B", and are stored in the first memory 10. With such a configuration, it is possible to properly perform the scan test by using the scan input data 11 stored in the first memory 10.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:
1. A memory tester comprising:
   a first memory configured to store scan input data and expected value data, the scan input data including a don't care bit, the expected value data being obtained by converting the don't care bit of the scan input data into a first predetermined value;
   a second memory configured to store scan output data and mask data, the scan output data being outputted from a scan test circuit, the mask data being obtained by converting a value of the scan input data other than the don't care bit into a second predetermined value;
   an arithmetic circuit configured to perform an exclusive or operation between the expected value data and the scan output data; and
   a determination circuit configured to determine whether the don't care bit of an arithmetic result from the arithmetic circuit is passed or failed by using the mask data,
   wherein the scan input data are divided into groups of a predetermined number of bits, and are stored in the first memory in a state where a bit string of data obtained by division and having the predetermined number of bits is inverted.
2. The memory tester according to claim 1, wherein the predetermined number of bits is 8 bits.

* * * * *